(12) United States Patent
Zhao

(10) Patent No.: US 10,419,052 B2
(45) Date of Patent: Sep. 17, 2019

(54) CHIP CARD FIXING ASSEMBLY AND ELECTRONIC DEVICE WITH SAME

(71) Applicants: Fu Tai Hua Industry (Shenzhen) Co., Ltd., Shenzhen (CN); HON HAI PRECISION INDUSTRY CO., LTD., New Taipei (TW)

(72) Inventor: Qian-Fa Zhao, Shenzhen (CN)

(73) Assignees: Fu Tai Hua Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/792,789

(22) Filed: Oct. 25, 2017

(65) Prior Publication Data

US 2018/0316378 A1 Nov. 1, 2018

(30) Foreign Application Priority Data

Apr. 28, 2017 (CN) .......................... 2017 1 0295873

(51) Int. Cl.
*H05K 5/02* (2006.01)
*H04B 1/3816* (2015.01)
*G06K 19/077* (2006.01)
*G06K 13/08* (2006.01)

(52) U.S. Cl.
CPC .......... *H04B 1/3816* (2013.01); *G06K 13/085* (2013.01); *G06K 13/0862* (2013.01); *G06K 19/07739* (2013.01); *H05K 5/0295* (2013.01); *H04M 2250/14* (2013.01)

(58) Field of Classification Search
CPC ............. G06K 13/085; G06K 13/0862; G06K 19/07739; H05K 5/0295; H04M 2250/14
See application file for complete search history.

(56) References Cited

U.S. PATENT DOCUMENTS

| | | | |
|---|---|---|---|
| 8,651,884 B1* | 2/2014 | Rivera ................. | H01R 13/635 439/159 |
| 9,178,311 B1* | 11/2015 | Rivera ................. | H01R 13/635 |
| 9,685,735 B1* | 6/2017 | Chen ..................... | H01R 24/62 |
| 2007/0128913 A1* | 6/2007 | Zuo ....................... | H01R 13/629 439/325 |
| 2009/0303689 A1* | 12/2009 | Chang ................... | H01R 12/57 361/760 |
| 2012/0276780 A1* | 11/2012 | Hu ........................ | H01R 12/714 439/630 |
| 2013/0286608 A1* | 10/2013 | Liang ................... | H05K 7/1402 361/754 |
| 2017/0280579 A1* | 9/2017 | Tan ........................ | H01R 24/62 |

* cited by examiner

*Primary Examiner* — Hoa C Nguyen
*Assistant Examiner* — Keith DePew
(74) *Attorney, Agent, or Firm* — ScienBiziP, P.C.

(57) ABSTRACT

A chip card fixing assembly is received inside a charging interface of an electronic device for fixing a chip card inside the charging interface. The chip card fixing assembly includes a resisting assembly including at least one pushing member and a securing member including at least one fixing portion. The at least one fixing portion and the at least one pushing member cooperatively define a securing space therebetween for fixing the chip card.

16 Claims, 4 Drawing Sheets

CHIP CARD FIXING ASSEMBLY AND ELECTRONIC DEVICE WITH SAME

CROSS-REFERENCE TO RELATED APPLICATIONS

This application claims priority to Chinese Patent Application No. 201710295873.3 filed on Apr. 28, 2017, the contents of which are incorporated by reference herein.

FIELD

The subject matter herein generally relates to an electronic device, and more particularly to an electronic device having a chip card fixing assembly received in a charging interface thereof.

BACKGROUND

Generally, electronic devices such as mobile phones and tablet computers have an interface for charging the electronic device and a slot for inserting a chip card, such as a SIM card or a data card.

BRIEF DESCRIPTION OF THE DRAWINGS

Implementations of the present technology will now be described, by way of example only, with reference to the attached figures.

DETAILED DESCRIPTION

Figure 1:
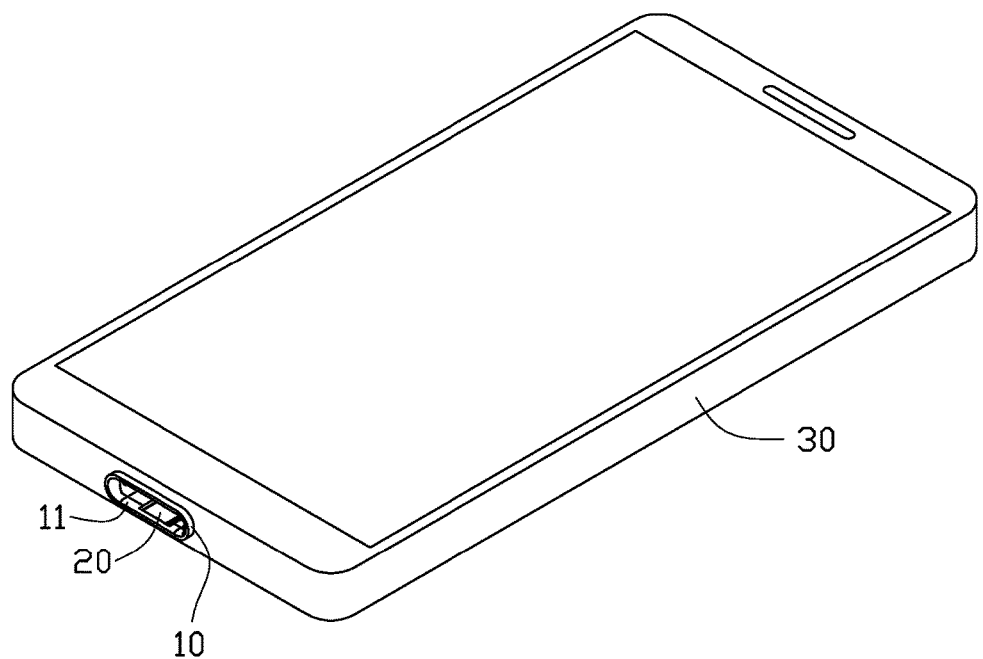
FIG. 1 is an assembled, isometric view of an electronic device having a chip card fixing assembly.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other word that "substantially" modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series and the like.

FIG. 1 illustrates an embodiment of an electronic device 1. The electronic device 1 can include a charging interface 10, a chip card fixing assembly 20, and a main body 30. The electronic device 1 can be a mobile phone, a tablet computer, or any electronic device that uses a chip card.

In at least one embodiment, the charging interface 10 is arranged on an end surface of the main body 30 to connect to a charging source for charging the electronic device 1. An opening 11 is defined in the charging interface 10. The chip card fixing assembly 20 is arranged inside the charging interface 10.

Figure 2:
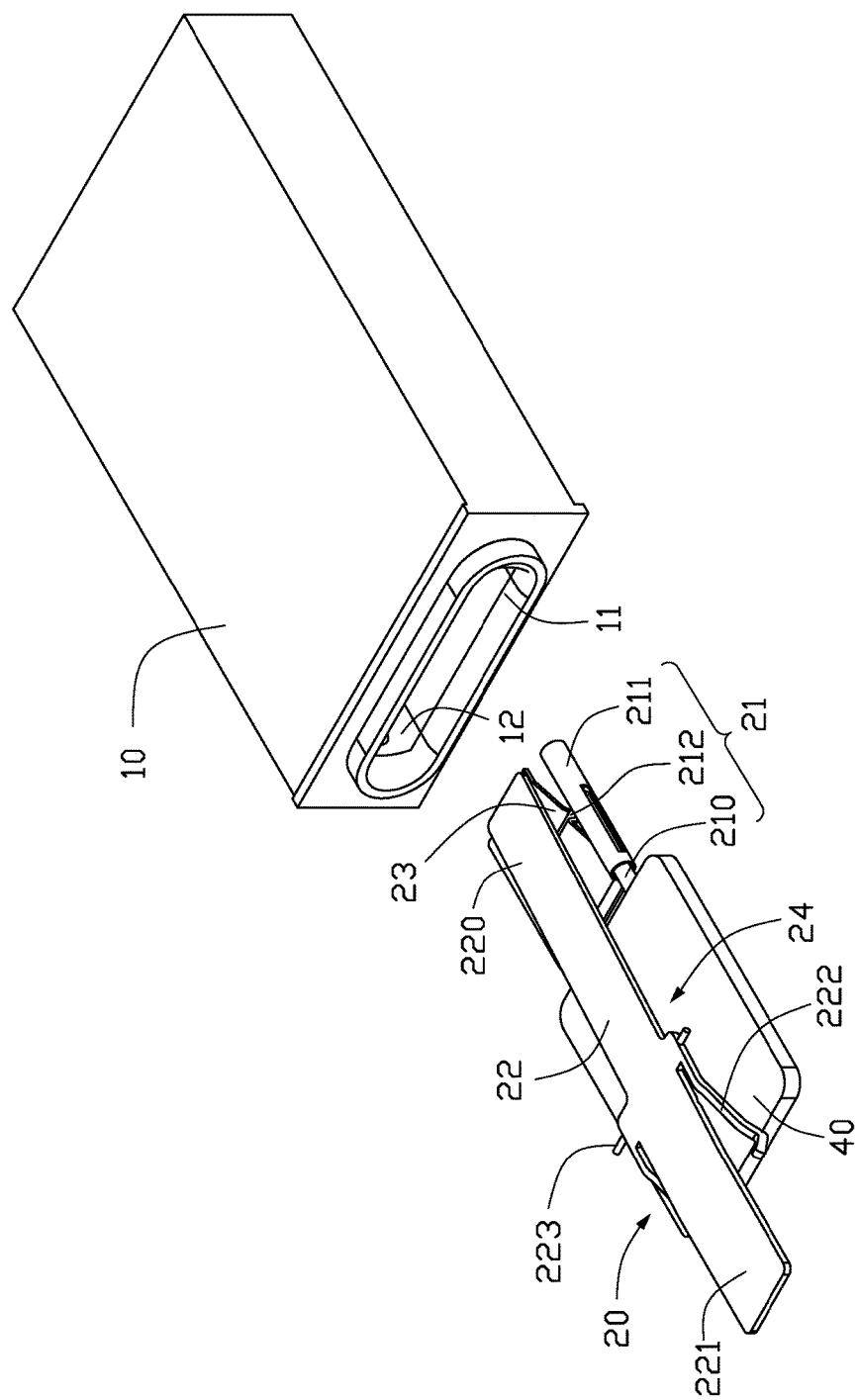
FIG. 2 is an exploded view of FIG. 1 showing the chip card fixing assembly.
Figure 3:
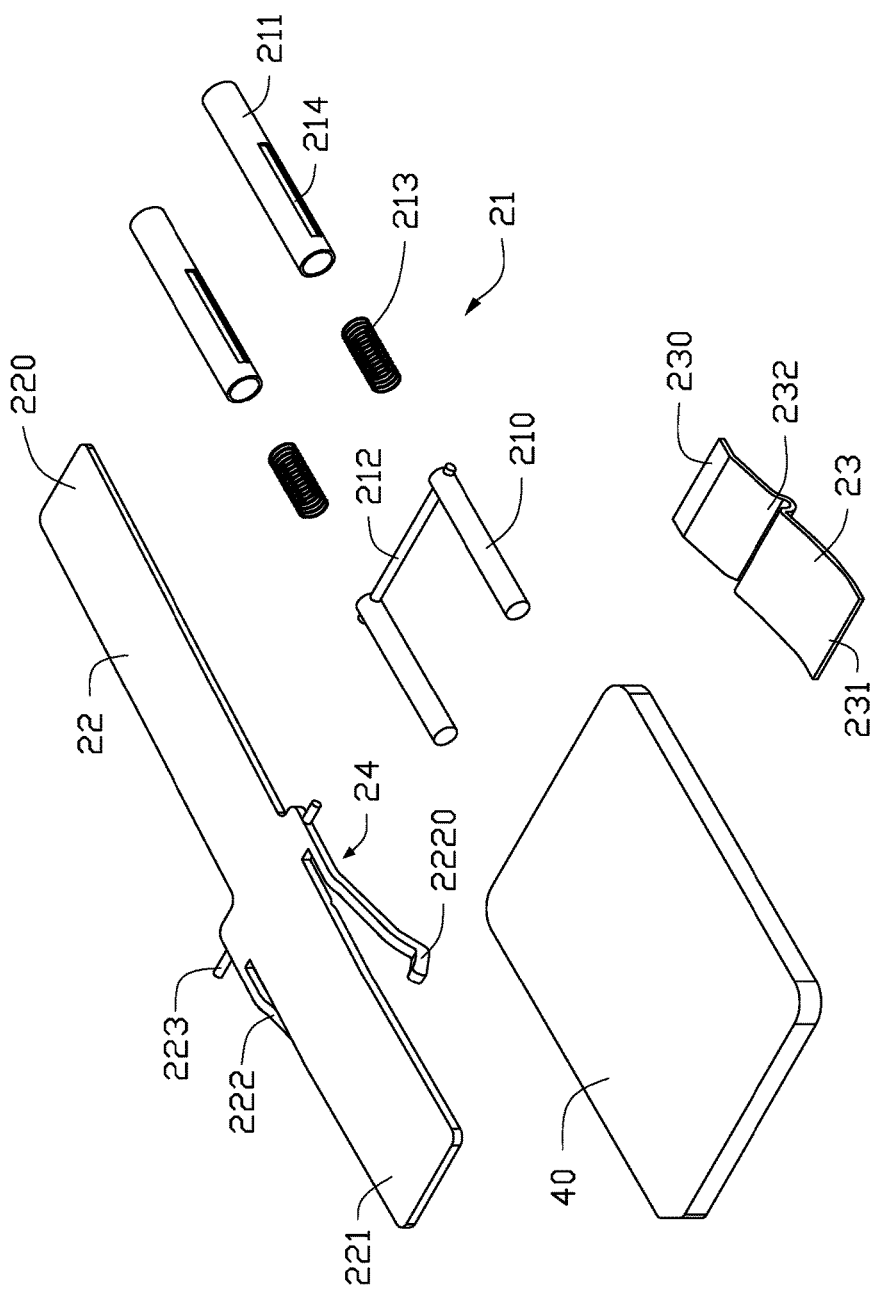
FIG. 3 is an exploded view of the chip card fixing assembly of FIG. 2.

Referring to FIGS. 2 and 3, the chip card fixing assembly 20 can include a resisting assembly 21, a securing member 22, and a limiting member 23. The resisting assembly 21 is received in the charging interface 10 and includes at least one pushing member 210, a corresponding guiding member 211, a corresponding elastic member 213, and a guiding bar 212.

In the illustrated embodiment, the resisting assembly 21 includes two pushing members 210, two corresponding guiding members 211, and two corresponding elastic members 213. Each guiding member 211 is substantially hollow tubular shaped. A guiding groove 214 is defined along one side of each guiding member 211. The pushing members 210 are arranged substantially parallel to each other. Each of opposite ends of the guiding bar 212 can be fixed to an end portion of a corresponding pushing member 210. The guiding bar 212 fixed between the two pushing members 210 can form substantially a "U" shape. Each pushing member 210 can be received into the corresponding guiding member 211. When the pushing members 210 are pushed, the guiding bar 212 can slide along the guiding grooves 214.

In at least one embodiment, the elastic members 213 are springs. The elastic members 213 are received into the corresponding guiding members 211. One end of the elastic member 213 is fixed to an inside wall of the guiding member 211, and another end of the elastic member 213 abuts against the pushing member 210. When the pushing member 210 is pushed, the elastic member 213 is compressed.

The limiting member 23 is arranged between the two guiding members 211. The limiting member 23 can be made of elastic materials and includes a first end portion 230 and an opposite second end portion 231. The first end portion 230 can abut against an end wall of the charging interface 10. A latching groove 232 can be defined in a substantially central portion of the limiting member 23. When the pushing members 210 are pushed, the elastic members 213 are deformed. The pushing members 210 can be pushed until the guiding bar 212 is latched in the latching groove 232 of the limiting member 23, thereby preventing the pushing members 210 from being pushed back by the elastic members 213.

The securing member 22 can be received inside the charging interface 10 and cooperatively define a securing space 24 with the charging interface 10 for securing a chip card 40. In at least one embodiment, the chip card 40 can be a SIM card or a storage card. The securing member 22 can include a first end 220 and a second end 221 opposite to the first end 220. The first end 220 can abut against the first end portion 230 of the limiting member 23 and abut against the end wall of the charging interface 10. The second end 221 can be adjacent to the opening 11.

The securing member 22 can include at least one securing portion 222 and an axle 223. In the illustrated embodiment, there are two securing portion 222. The securing portions 222 can be made of elastic materials. The securing portions 222 can be arranged on opposite sides of the securing member 22. The axle 223 can extend through the securing member 22. Opposite ends of the axle 223 can be secured to an inner wall 12 of the charging interface 10, and the securing member 22 can rotate about the axle 223. An end of each securing portion 222 can form a hook 2220. The hooks 2220 can be used for latching an end of the chip card 40 when the chip card 40 is latched in the securing space 24, thereby preventing the chip card 40 from coming out of the opening 11.

Figure 4:
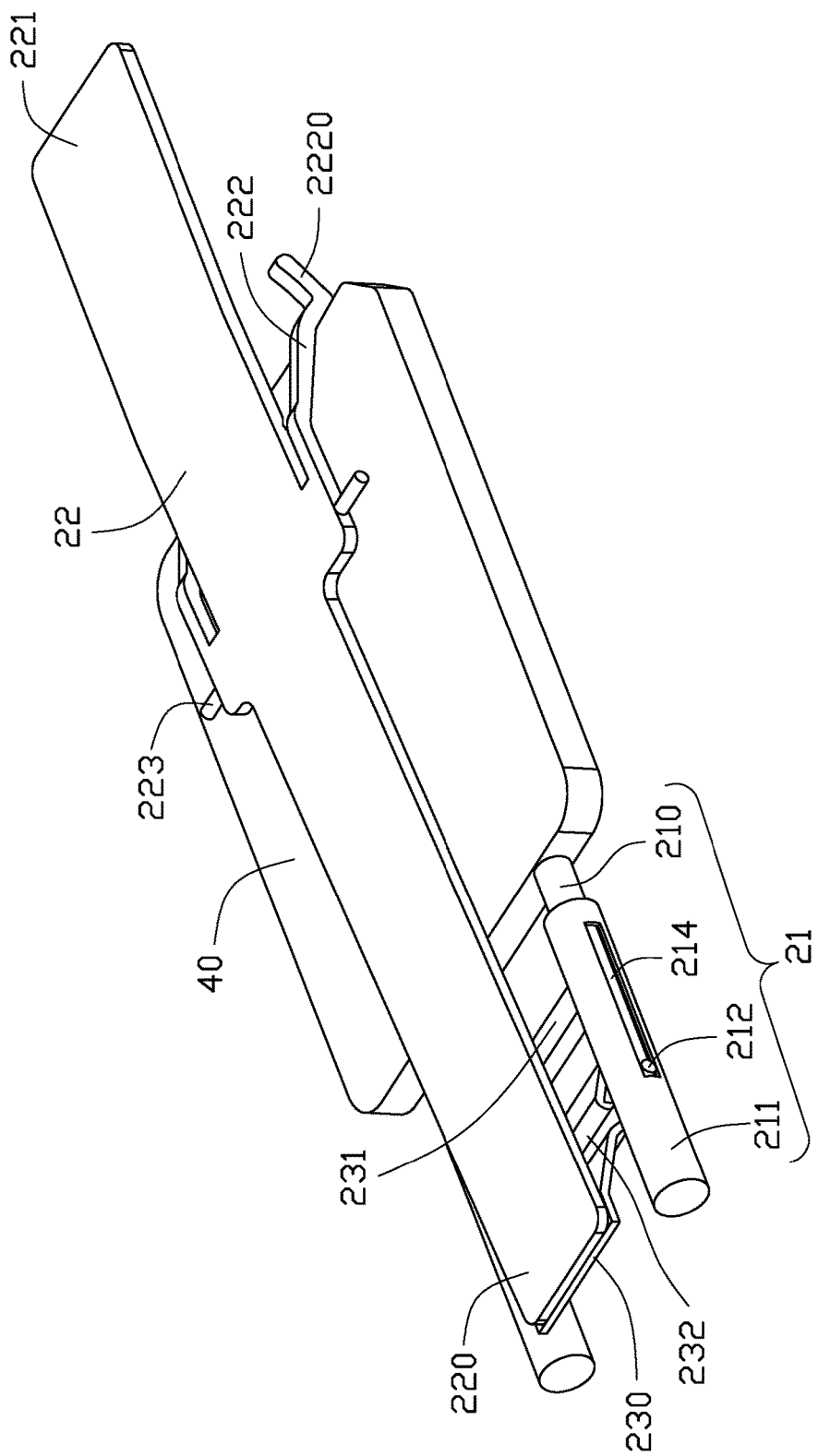
FIG. 4 is an assembled view of the chip card fixing assembly.

Referring to FIG. 4, to insert the chip card 40 into the chip card fixing assembly 20, the chip card 40 can be inserted through the opening 11 and pushed to push the pushing members 210 and deform the elastic members 213. The chip card 40 can be pushed until the guiding bar 212 is latched in the latching groove 232, thereby securing the chip card 40 in the securing space 24. The first end portion 230 of the limiting member 23 abuts against the first end 220 of the securing member 22. The hooks 2220 latch the end of the chip card 40 to secure the chip card 40 in the securing space 24.

To remove the chip card 40 from the chip card fixing assembly 20, the second end 221 of the securing member 22 can be lifted along a first direction. The second end 221 lifted along the first direction causes the securing member 22 to rotate about the axle 223 and causes the hooks 2220 to disengage from the chip card 40. The securing member 22 rotating about the axle 223 causes the first end 220 to move along a second direction opposite to the first direction and press against the first end portion 230 of the limiting member 23, thereby causing the limiting member 23 to move along the second direction. The limiting member 23 moving along the second direction causes the guiding bar 212 to disengage from the latching groove 232. When the guiding bar 212 is disengaged from the latching groove 232, the restoring force of the elastic members 213 can push the pushing members 210 back, which in turn pushes the chip card 40 out of the opening 11 of the charging interface 10.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A chip card fixing assembly received inside a charging interface of an electronic device for fixing a chip card inside the charging interface, the charging interface defining an opening, the chip card fixing assembly comprising:
    a resisting assembly comprising at least one pushing member;
    a securing member comprising at least one fixing portion, the at least one fixing portion and the at least one pushing member cooperatively defining a securing space therebetween, the securing space communicating with the opening, the at least one fixing portion and the at least one pushing member configured to cooperatively fix the chip card in the securing space after the chip passes through the opening; and
    a limiting member comprising a first end portion and a second end portion, the first end portion of the limiting member abutting against inside the charging interface, a surface of the limiting member defining a latching groove for latching the pushing member of the resisting assembly in place;
    wherein a first end of the securing member abuts against inside the charging interface, the first end of the securing member abuts against the first end portion of the limiting member, the resisting assembly comprises two pushing members and a guiding bar, each of opposite ends of the guiding bar is fixed to an end portion of a corresponding pushing member, the pushing members are pushed until the guiding bar is latched into the latching groove of the limiting member when the chip card is pushed into the charging interface.

2. The chip card fixing assembly of claim 1, wherein the fixing portion of the securing member comprises a hook, the hook secures the chip card in the securing space when the guiding bar is latched into the latching groove of the limiting member.

3. The chip card fixing assembly of claim 2, wherein the securing member comprises two fixing portions and an axle; the two fixing portions are located on opposite sides of the securing member; opposite ends of the axle are fixed to an inner wall of the charging interface; the securing member is rotatable about the axle.

4. The chip card fixing assembly of claim 3, wherein the securing member comprises a second end opposite to the first end, the second end is adjacent to the opening when the securing member is received in the charging interface.

5. The chip card fixing assembly of claim 4, further comprising two guiding members and two elastic members; wherein each elastic member and one corresponding pushing member are received in one corresponding guiding member, one end of the pushing member abuts against the elastic member, another end of the pushing member protrudes out of the guiding member.

6. The chip card fixing assembly of claim 5, wherein each guiding member has a guiding groove defined therein for receiving a corresponding end of the guiding bar, the guiding bar is slidable along the guiding grooves of the guiding members.

7. The chip card fixing assembly of claim 6, wherein the guiding bar slides along the guiding grooves and elastically deforms the elastic members in the guiding members and is latched in the latching groove of the limiting member when the chip card is pushed through the opening to push the pushing members.

8. The chip card fixing assembly of claim 7, wherein to remove the chip card from the charging interface, an external force is applied to the second end of the securing member along a first direction, the securing member rotates about the axle and causes the first end of the securing member to move along a second direction opposite to the first direction, the first end of the securing member deforms the first end portion of the limiting portion, thereby causing the guiding bar to be removed from the latching groove of the limiting portion, a restoring force of the elastic members pushes the chip card out of the opening of the charging interface.

9. An electronic device comprising a main body, a charging interface arranged in the main body, and a chip card fixing assembly arranged in the charging interface, the charging interface defining an opening, the chip card fixing assembly comprising:

a resisting assembly comprising at least one pushing member;

a securing member comprising at least one fixing portion, the at least one fixing portion and the at least one pushing member cooperatively defining a securing space therebetween, the securing space communicating with the opening, the at least one fixing portion and the at least one pushing member configured to cooperatively fix the chip card in the securing space after the chip passes through the opening; and a limiting member comprising a first end portion and a second end portion, the first end portion of the limiting member abutting against inside the charging interface, a surface of the limiting member defining a latching groove for latching the pushing member of the resisting assembly in place;

wherein a first end of the securing member abutting against inside the charging interface, the first end of the securing member abuts against the first end portion of the limiting member, the resisting assembly comprises two pushing members and a guiding bar, each of opposite ends of the guiding bar is fixed to an end portion of a corresponding pushing member, the pushing members are pushed until the guiding bar is latched into the latching groove of the limiting member when the chip card is pushed into the charging interface.

10. The electronic device of claim 9, wherein the fixing portion of the securing member comprises a hook, the hook secures the chip card in the securing space when the guiding bar is latched into the latching groove of the limiting member.

11. The electronic device of claim 10, wherein the securing member comprises two fixing portions and an axle; the two fixing portions are located on opposite sides of the securing member; opposite ends of the axle are fixed to an inner wall of the charging interface; the securing member is rotatable about the axle.

12. The electronic device of claim 11, wherein the securing member comprises a second end opposite to the first end, the second end is adjacent to the opening when the securing member is received in the charging interface.

13. The electronic device of claim 12, further comprising two guiding members and two elastic members; wherein each elastic member and one corresponding pushing member are received in one corresponding guiding member, one end of the pushing member abuts against the elastic member, another end of the pushing member protrudes out of the guiding member.

14. The electronic device of claim 13, wherein each guiding member has a guiding groove defined therein for receiving a corresponding end of the guiding bar, the guiding bar is slidable along the guiding grooves of the guiding members for slidably coupling the pushing members to the guiding member.

15. The electronic device of claim 14, wherein the guiding bar slides along the guiding grooves and elastically deforms the elastic members in the guiding members and is latched in the latching groove of the limiting member when the chip card is pushed through the opening to push the pushing members.

16. The electronic device of claim 15, wherein to remove the chip card from the charging interface, an external force is applied to the second end of the securing member along a first direction, the securing member rotates about the axle and causes the first end of the securing member to move along a second direction opposite to the first direction, the first end of the securing member deforms the first end portion of the limiting portion, thereby causing the guiding bar to be removed from the latching groove of the limiting portion, a restoring force of the elastic members pushes the chip card out of the opening of the charging interface.

* * * * *